United States Patent
Bentley et al.

(10) Patent No.: US 9,368,591 B2
(45) Date of Patent: Jun. 14, 2016

(54) TRANSISTORS COMPRISING DOPED REGION-GAP-DOPED REGION STRUCTURES AND METHODS OF FABRICATION

(71) Applicants: GLOBALFOUNDRIES Inc., Grand Cayman, KY (US); International Business Machines Corporation, Armonk, NY (US)

(72) Inventors: Steven J. Bentley, Watervliet, NY (US); Ajey Poovannummoottil Jacob, Watervliet, NY (US); Chia-Yu Chen, Yorktown Heights, NY (US); Tenko Yamashita, Schenectady, NY (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/334,950

(22) Filed: Jul. 18, 2014

(65) Prior Publication Data

US 2016/0020335 A1  Jan. 21, 2016

(51) Int. Cl.
*H01L 21/338* (2006.01)
*H01L 29/45* (2006.01)

(52) U.S. Cl.
CPC ...................................... *H01L 29/45* (2013.01)

(58) Field of Classification Search
CPC ................... H01L 29/66545; H01L 29/66477; H01L 29/785; H01L 29/66636; H01L 29/4966; H01L 29/6653; H01L 21/823814; H01L 29/517; H01L 29/66553; H01L 29/66621

USPC .................................. 257/256; 438/186, 183
See application file for complete search history.

(56) References Cited

U.S. PATENT DOCUMENTS

| | | | |
|---|---|---|---|
| 7,435,636 B1 * | 10/2008 | Hanafi | H01L 29/105 257/E21.441 |
| 2001/0055842 A1 * | 12/2001 | Uh | H01L 21/76895 438/183 |
| 2007/0001162 A1 * | 1/2007 | Orlowski et al. | 257/19 |
| 2007/0287259 A1 | 12/2007 | Kavalieros et al. | |
| 2008/0014741 A1 * | 1/2008 | Chen et al. | 438/623 |
| 2008/0102571 A1 * | 5/2008 | Pan | H01L 29/66545 438/197 |
| 2012/0043623 A1 * | 2/2012 | Doris et al. | 257/410 |
| 2013/0270613 A1 * | 10/2013 | Chou et al. | 257/288 |

\* cited by examiner

*Primary Examiner* — Duy T Nguyen
(74) *Attorney, Agent, or Firm* — Williams Morgan, P.C.

(57) ABSTRACT

Embodiments of the present invention provide transistors with controlled junctions and methods of fabrication. A dummy spacer is used during the majority of front end of line (FEOL) processing. Towards the end of the FEOL processing, the dummy spacers are removed and replaced with a final spacer material. Embodiments of the present invention allow the use of a very low-k material, which is highly thermally-sensitive, by depositing it late in the flow. Additionally, the position of the gate with respect to the doped regions is highly controllable, while dopant diffusion is minimized through reduced thermal budgets. This allows the creation of extremely abrupt junctions whose surface position is defined using a sacrificial spacer. This spacer is then removed prior to final gate deposition, allowing a fixed gate overlap that is defined by the spacer thickness and any diffusion of the dopant species.

8 Claims, 20 Drawing Sheets

TRANSISTORS COMPRISING DOPED REGION-GAP-DOPED REGION STRUCTURES AND METHODS OF FABRICATION

FIELD OF THE INVENTION

The present invention relates generally to semiconductor fabrication, and more particularly, to controlled junction transistors and methods of fabrication.

BACKGROUND

As transistors disposed on integrated circuits (ICs) become smaller, transistors with source/drain extensions have become more difficult to manufacture. As critical dimensions shrink, forming source and drain extensions becomes very difficult using conventional fabrication techniques. Conventional ion implantation techniques have difficulty maintaining shallow source and drain extensions because of dopant diffusion. The diffusion often extends the source and drain extension vertically into the semiconducting channel and underlying layers, while the use of alternative channel materials such as silicon-germanium or III-V materials may enhance dopant diffusivity, degrading resultant junction profiles. Highly scaled, advanced transistors benefit from precisely defined junction profiles and well-controlled gate overlap geometry to achieve well-behaved short-channel characteristics. Positioning the junction correctly with respect to the gate is challenging. Therefore, it is desirable to have improved and controllable methods of fabrication to address the aforementioned challenges.

SUMMARY

Embodiments of the present invention provide transistors with controlled junctions and methods of fabrication. A dummy spacer is used during the majority of front end of line (FEOL) processing. Towards the end of the FEOL processing, the dummy spacers are removed and replaced with a final spacer material. As the final spacer material is deposited after the high temperature FEOL processes, the final spacer material may be a thermally-sensitive material which can withstand only lower processing temperatures, allowing for greater flexibility in selection of the final spacer material. That is, embodiments of the present invention allow the use of a very low-k material, which is highly thermally-sensitive, by depositing it late in the flow. Additionally, the position of the gate with respect to the doped regions is highly controllable, while dopant diffusion is minimized through reduced thermal budgets. This allows the creation of extremely abrupt junctions whose surface position is defined using a sacrificial spacer. This spacer is then removed prior to final gate deposition, allowing a fixed gate overlap that is defined by the spacer thickness and any diffusion of the dopant species. In this way, there is a high degree of control over the regions where dopants are placed. These controlled junctions can enable improved device performance. As an added benefit, embodiments of the present invention require no additional patterning, and can easily be integrated into an existing replacement metal gate (RMG) flow.

In a first aspect, embodiments of the present invention provide a method of forming a semiconductor structure, comprising: forming a plurality of doped regions in a semiconductor channel disposed on a semiconductor substrate, wherein the plurality of doped regions are formed adjacent to a dummy gate disposed on a dummy gate oxide, the dummy gate oxide disposed on the semiconductor substrate; forming a plurality of dummy spacers, wherein the plurality of dummy spacers are disposed adjacent to the dummy gate; forming a plurality of source/drain regions adjacent to the dummy gate; depositing a dielectric layer over the source/drain regions; removing the dummy gate to form a gate cavity; removing the plurality of dummy spacers; depositing a final spacer layer; performing an etch of the final spacer layer to form final spacers; removing the dummy gate oxide; and forming a metal gate in the gate cavity.

In a second aspect, embodiments of the present invention provide a method of forming a semiconductor structure, comprising: forming a metal gate on the semiconductor structure; forming a plurality of dummy spacers adjacent to the metal gate; depositing a contact metal adjacent to the plurality of dummy spacers; removing the plurality of dummy spacers to form a plurality of spacer cavities; forming doped regions in a semiconductor channel disposed at a bottom portion of each spacer cavity of the plurality of spacer cavities; and depositing a final spacer material in each spacer cavity of the plurality of spacer cavities.

In a third aspect, embodiments of the present invention provide a semiconductor structure comprising: a semiconductor substrate; two doped regions formed on a semiconductor channel disposed on the semiconductor substrate, having a gap between them; a metal gate disposed on the semiconductor substrate over the gap and extending over each of the two doped regions; a plurality of spacers formed adjacent to the metal gate and in contact with one of the two doped regions; and a cap region disposed on the metal gate.

BRIEF DESCRIPTION OF THE DRAWINGS

The accompanying drawings, which are incorporated in and constitute a part of this specification, illustrate several embodiments of the present teachings and together with the description, serve to explain the principles of the present teachings. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," "some embodiments", or similar language means that a particular feature, structure, or characteristic described in connection with the embodiment is included in at least one embodiment of the present invention. Thus, appearances of the phrases "in one embodiment," "in an embodiment," "in embodiments", "in some embodiments", and similar language throughout this specification may, but do not necessarily, all refer to the same embodiment. One or more features of an embodiment may be "mixed and matched" with features of another embodiment.

The terms "overlying" or "atop", "positioned on, "positioned atop", or "disposed on", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

Figure 1:
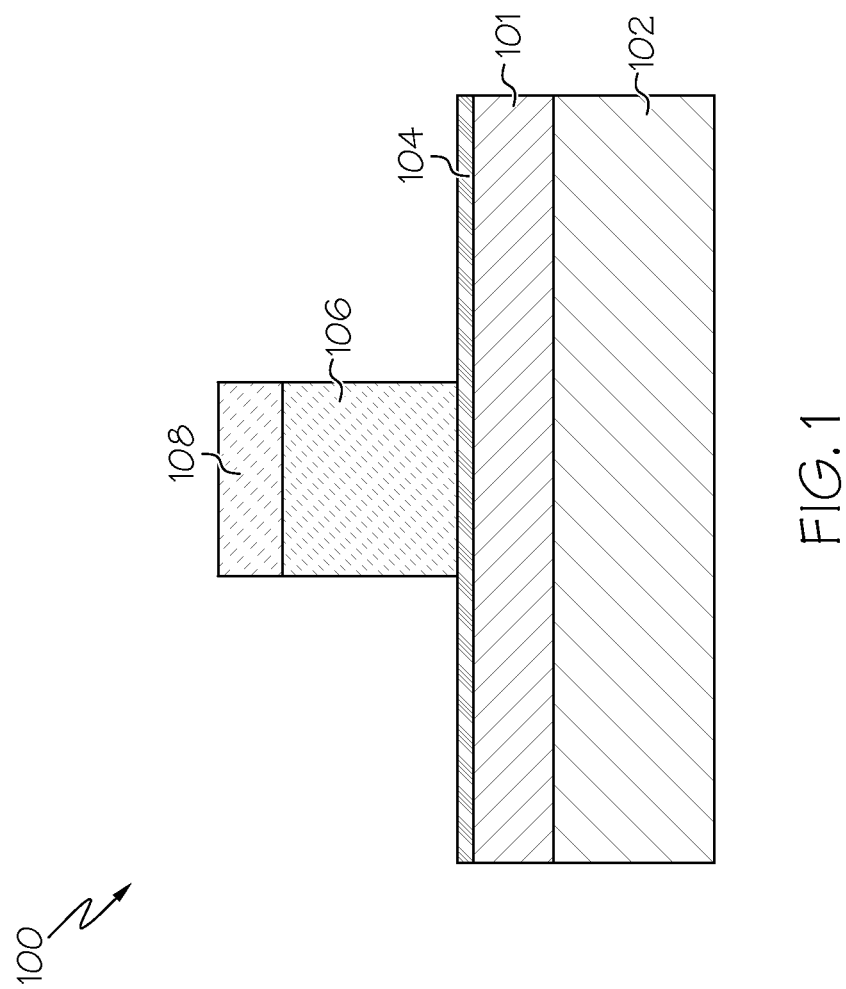
FIG. 1 shows a semiconductor structure at a starting point for embodiments of the present invention.

FIG. 1 shows a semiconductor structure at a starting point for embodiments of the present invention. Semiconductor structure 100 comprises a semiconductor channel 101 formed above a semiconductor substrate 102. In embodiments, the semiconductor substrate 102 may be silicon (Si) or silicon on insulator (SOI). In some embodiments, the semiconductor channel 101 may comprise silicon, silicon-germanium, germanium, a III-V compound semiconductor material or materials, or 2D materials such as graphene or metal dichalcogenides. Additionally, the channel 101 may be realized in non-planar architectures such as fin or nanowire configurations by incorporating earlier etch steps. A dummy gate interfacial material 104 is disposed over the semiconductor substrate 102. In embodiments, the dummy gate interfacial material 104 may be an oxide such as silicon oxide and/or aluminum oxide. A dummy gate 106 is disposed on the dummy gate interfacial material 104. In embodiments, the dummy gate 106 may be polysilicon or other suitable material. A gate capping layer 108 may be disposed over the dummy gate 106. In embodiments, the gate capping layer 108 may be a nitride such as silicon nitride (SiN), or it may be comprised of multiple layers.

Figure 2:
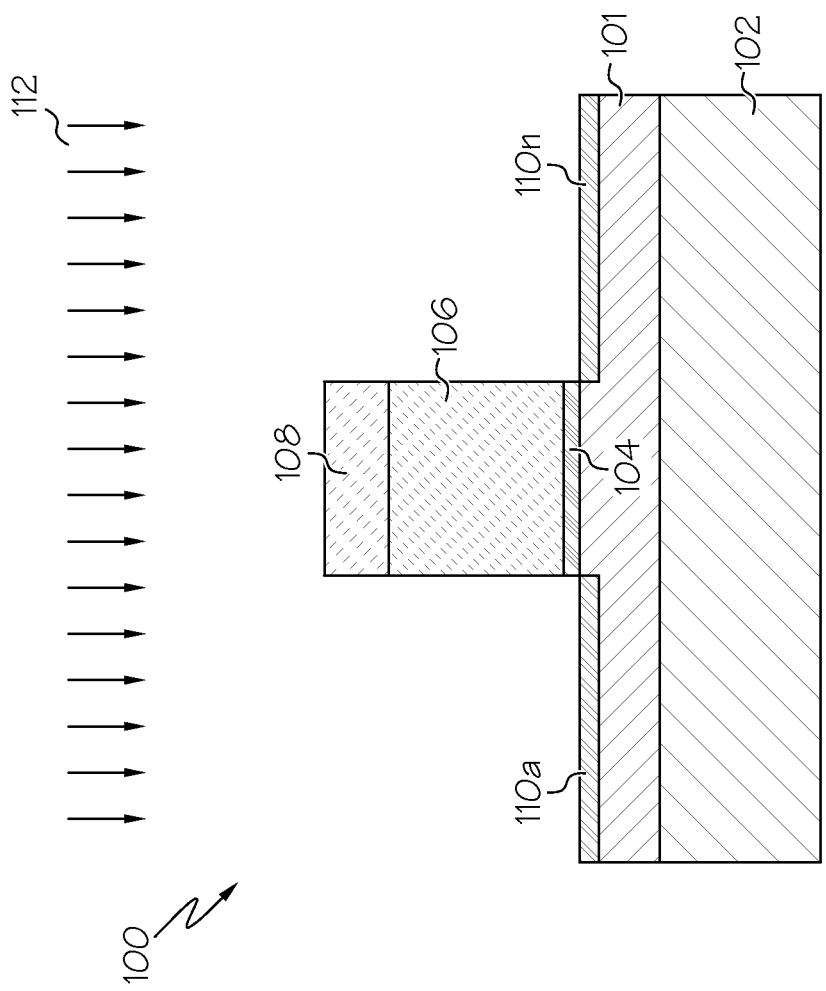
FIG. 2 shows a semiconductor structure after a subsequent process step of forming doped regions.

FIG. 2 shows a semiconductor structure after a subsequent process step of forming doped regions. Exposed portions of dummy gate oxide 104 are removed from over substrate 102, leaving the dummy gate oxide 104 only below dummy gate 106. In embodiments, the removal is achieved with a selective wet or dry etch process. A plurality of doped regions 110a-110n are formed on the semiconductor channel 101 that is disposed on the semiconductor substrate 102 adjacent the dummy gate 106. The two regions 110a and 110n are formed on the semiconductor substrate having a gap between them, with the dummy gate 106 disposed over the gap. In embodiments, the plurality of doped regions 110a and 110n are formed by ion implantation, plasma doping, or monolayer doping, shown generally at 112. In embodiments featuring a Group IV channel 101, dopants may include one or more of, for example, arsenic, phosphorous, antimony, and/or boron. In embodiments featuring a Group III-IV channel 101, dopants may include, for example, silicon (Si), carbon (C), magnesium (Mg), sulfur, (S), zinc (Zn), or tellurium (Te).

Figure 3:
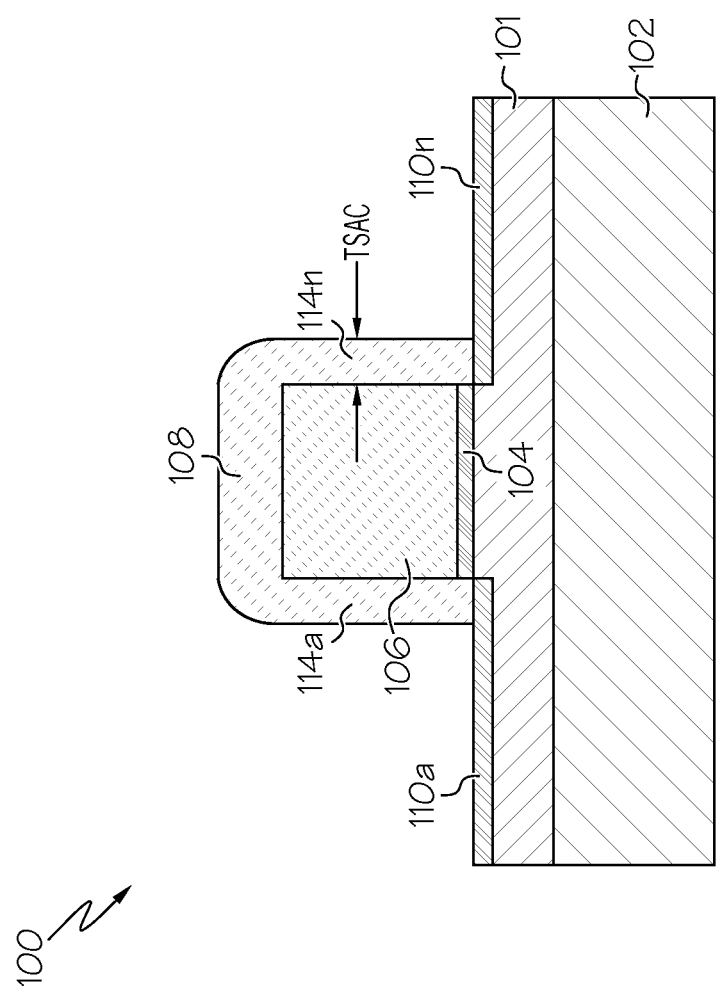
FIG. 3 shows a semiconductor structure after a subsequent process step of dummy spacer formation.

FIG. 3 shows a semiconductor structure after a subsequent process step of dummy spacer formation. A plurality of dummy spacers 114a and 114n are formed adjacent dummy gate 106. The width of each spacer is shown as Tsac. In embodiments, Tsac may range from 2-20 nanometers.

Figure 4:
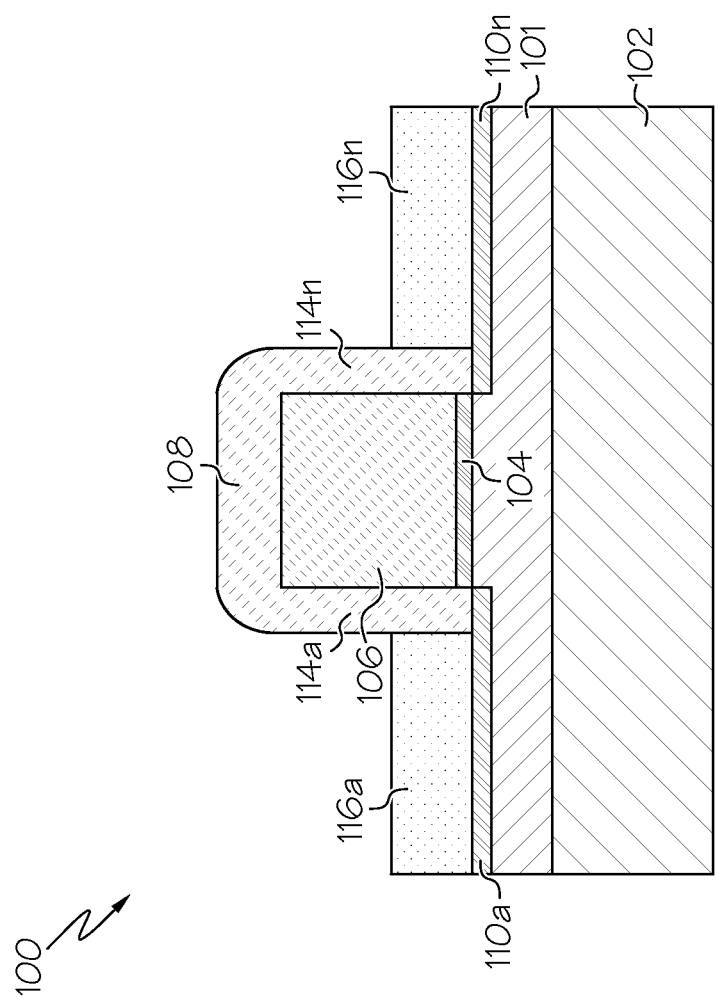
FIG. 4 shows a semiconductor structure after a subsequent process step of forming source/drain epitaxial regions.

FIG. 4 shows a semiconductor structure 100 after a subsequent process step of forming source/drain regions 116a and 116n adjacent to the dummy gate 106. In embodiments, the plurality of source/drain regions 116a and 116n may be epitaxial source/drain regions. In embodiments, the plurality of source/drain regions 116a and 116n may include, for example, silicon, silicon germanium, and/or a III-V material. In other embodiments, not shown, these regions may be embedded into the channel by first partially or fully recessing the channel, then epitaxially growing the source/drain material.

Figure 5:
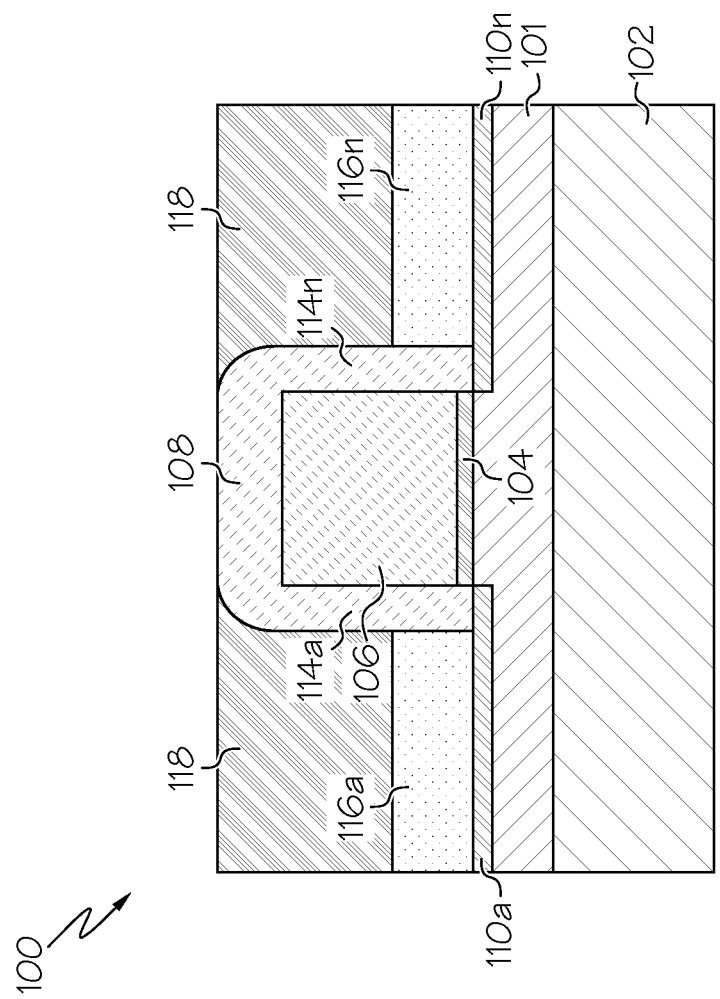
FIG. 5 shows a semiconductor structure after a subsequent process step of forming a dielectric region.

FIG. 5 shows a semiconductor structure 100 after a subsequent process step of forming a dielectric region. A dielectric layer 118 is deposited over the plurality of source/drain regions 116a and 116n. In embodiments, the dielectric layer may be comprised of silicon oxide, or multiple layers of various oxides and/or other dielectric layers. In embodiments, the dielectric layer 118 may be deposited by chemical vapor deposition (CVD) or another suitable method. The layer may be planarized using chemical mechanical planarization (CMP), which may also be used to control the geometry of the sacrificial spacers.

Figure 6:
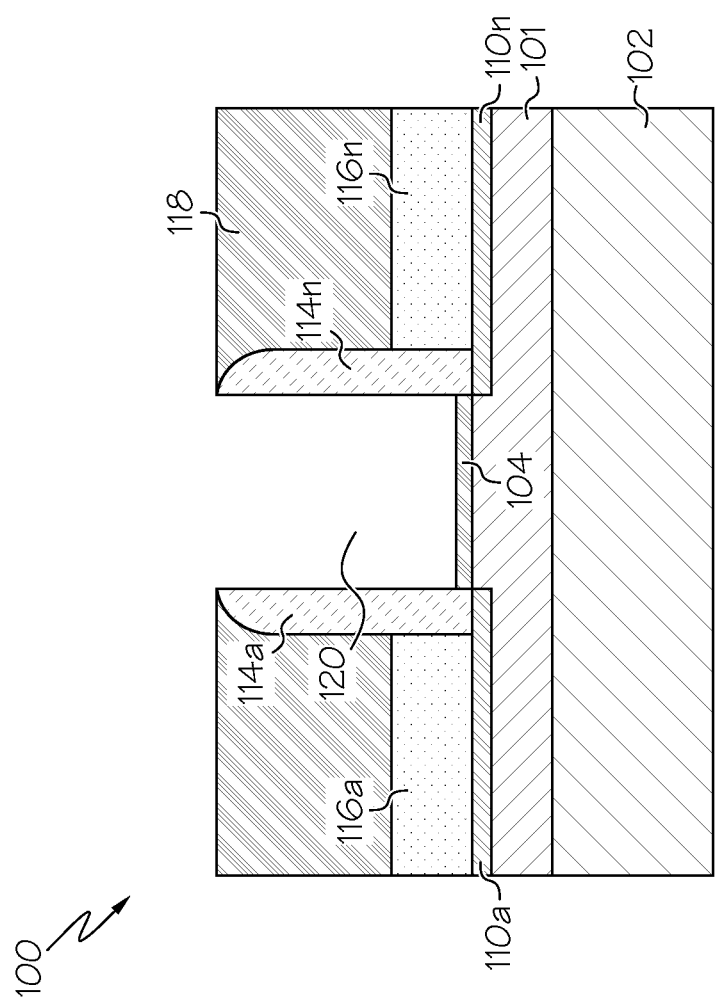
FIG. 6 shows a semiconductor structure after a subsequent process step of removing the dummy gate.

FIG. 6 shows a semiconductor structure 100 after a subsequent process step of removing the dummy gate. Removing the dummy gate 106 creates gate cavity 120. Dummy gate oxide 104 remains intact at the base of cavity 120. In some embodiments, the removal of the dummy gate 106 is performed by, for example, a reactive ion etch (RIE) process, or by ammonia-containing wet etch.

Figure 7:
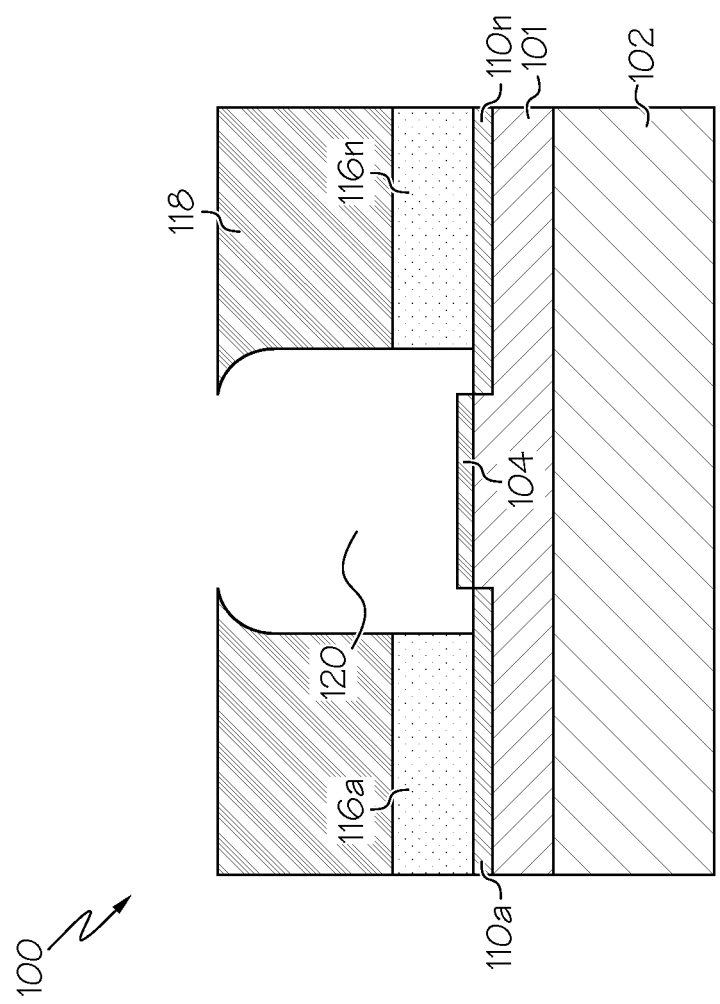
FIG. 7 shows a semiconductor structure after a subsequent process step of removing the dummy spacers.

FIG. 7 shows a semiconductor structure 100 after a subsequent process step of removing the plurality of dummy spacers 114a and 114b. In embodiments, the removal is achieved by, for example, a hot phosphoric acid etch process, a reactive ion etch (RIE) process, or other etch chemistries highly selective to oxide. The removal creates an expanded gate cavity 120 and leaves dummy gate oxide layer 104 intact.

Figure 8:
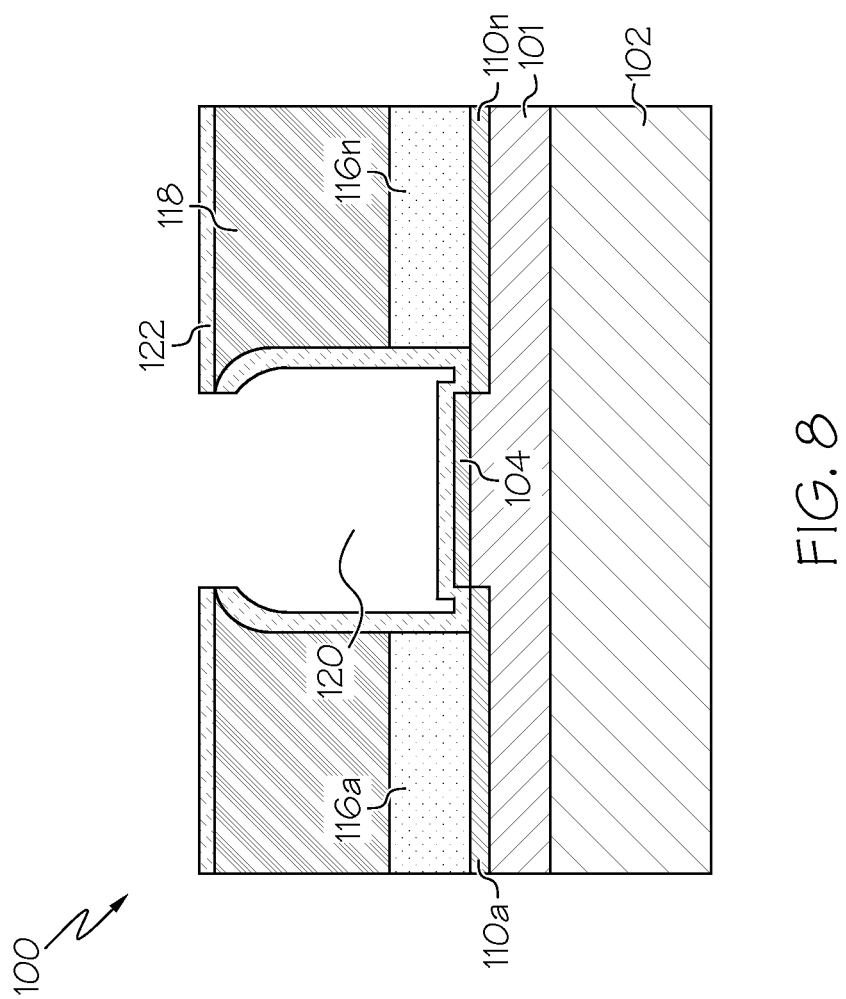
FIG. 8 shows a semiconductor structure after a subsequent process step of depositing the final spacers.

FIG. 8 shows a semiconductor structure 100 after a subsequent process step of depositing the final spacers. A final spacer layer 122 is deposited, in some embodiments, by atomic layer deposition, or another suitable conformal method. The final spacer layer may be deposited over the walls of the cavity 120, and the top of the dielectric layer 118. In some embodiments, final spacer material may be, for example, silicon nitride, or low-dielectric constant materials such as silicon boron carbon nitride (SiBCN) or silicon oxycarbonnitride (SiOCN).

Figure 9:
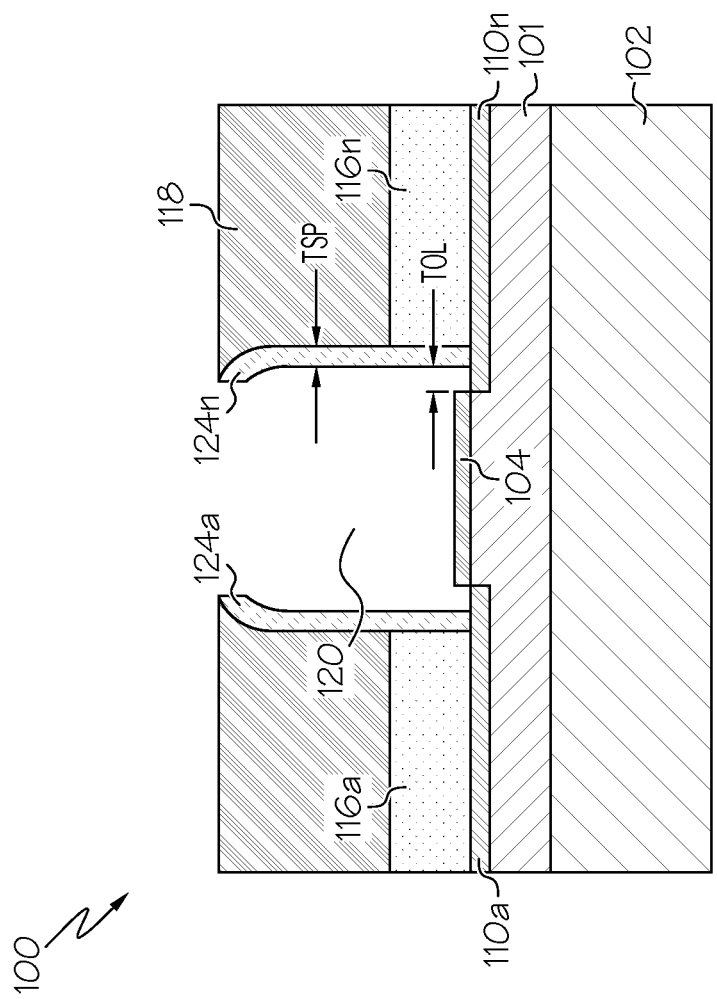
FIG. 9 shows a semiconductor structure after a subsequent process step of etching the final spacers.

FIG. 9 shows a semiconductor structure 100 after a subsequent process step of etch-back of the final spacers. An etch of the final spacer layer 122 is performed to form final spacers 124a and 124n using anisotropic RIE or atomic layer etch (ALE) techniques. The final spacer material therefore becomes constrained to the inner walls of gate cavity 120. In embodiments, the thickness of the final etched spacers Tsp is 0.5-10 nanometers. The length of the channel overlap region, Tol, is then defined by the difference in thicknesses of the sacrificial spacer and the final spacer, Tsac-Tsp. In embodiments, the Tol is 0.1-10 nanometers. In some embodiments, the dummy gate oxide 104 may be left intact after spacer etchback, or may be removed during processing of the dummy and final spacers.

Figure 10:
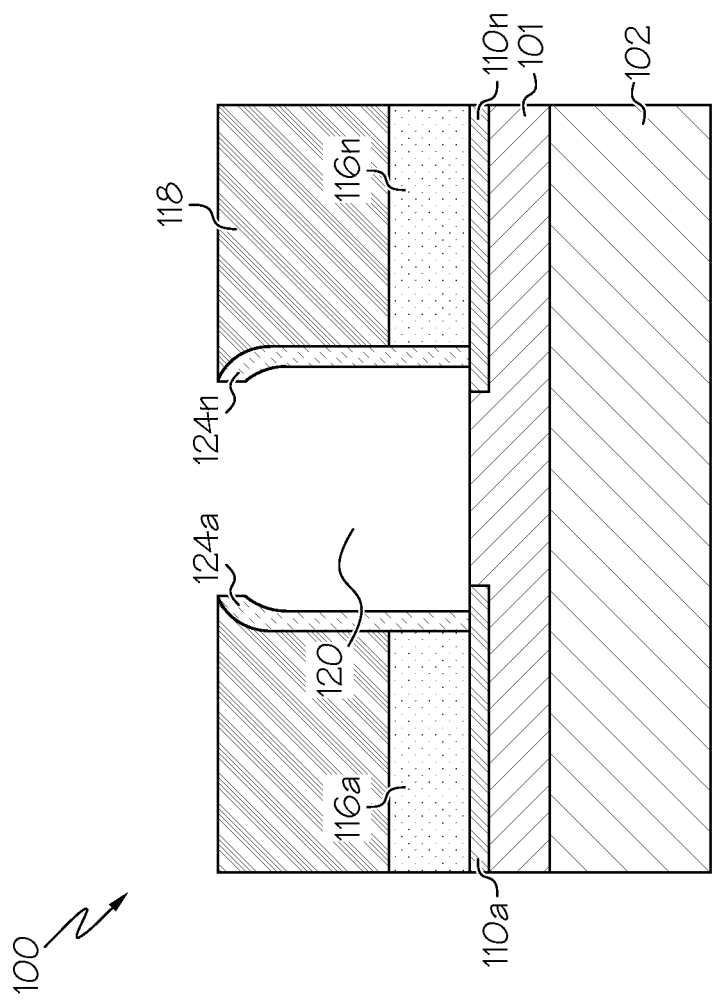
FIG. 10 shows a semiconductor structure after a subsequent process step of removing the dummy gate oxide.

FIG. 10 shows a semiconductor structure 100 after a subsequent process step of removing the dummy gate oxide. Dummy gate oxide 104 is removed from the gate cavity 120. In embodiments, the removal may be achieved using, for example, a chemical oxide removal (COR) process, Siconi or Frontier process, or a wet etch.

Figure 11:
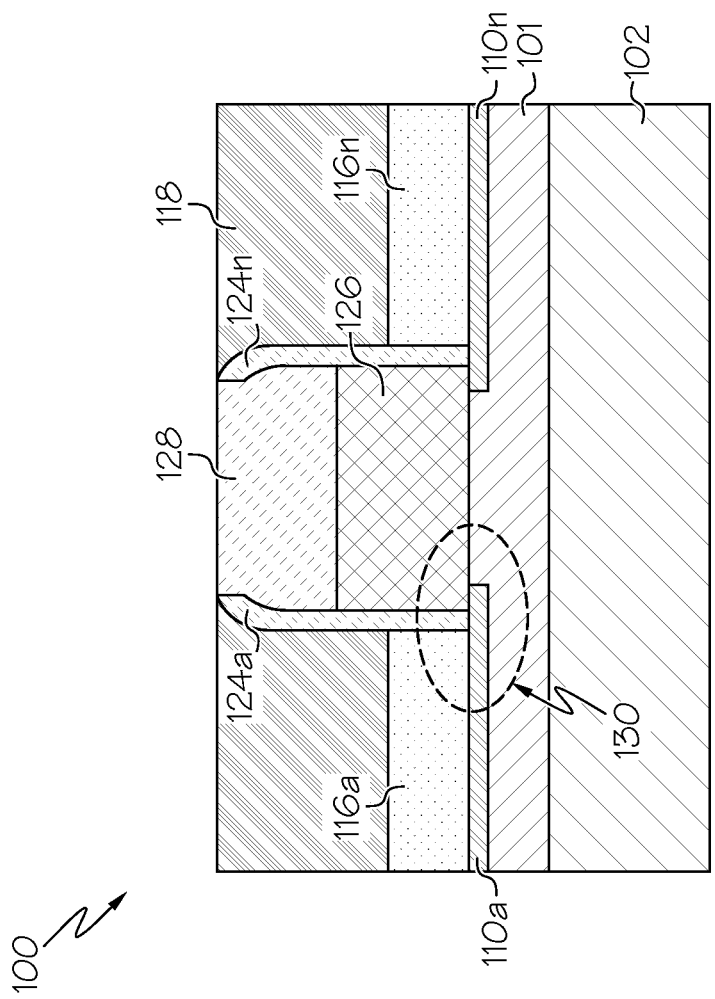
FIG. 11 shows a semiconductor structure after a subsequent process step of depositing a metal gate.

FIG. 11 shows a semiconductor structure 100 after a subsequent process step of depositing a metal gate. A replacement metal gate 126 is deposited into gate cavity 120. In embodiments, replacement metal gate 126 may include tungsten, aluminum, multiple workfunction metal layers, such as titanium, and gate dielectric layers (not shown), which may include hafnium oxide, silicon oxide, aluminum oxide, zirconium oxide, or other dielectrics with desirable interfacial and electrical properties. A self-aligned capping layer 128 is deposited in gate cavity 120 over the replacement metal gate 126. It should be recognized that the final replacement metal gate 126 extends over the plurality of doped regions 110a-110n, an example of which is shown generally at reference number 130. The gate 126 extends by distance Tol (FIG. 9), which in embodiments, ranges from about 0.1 nanometers to about 10 nanometers. From this point forward, industry standard techniques may be used to complete fabrication of the integrated circuit. This may include, without limitation, gate contact formation and/or filling the remaining cavity with a dielectric layer.

Figure 12:
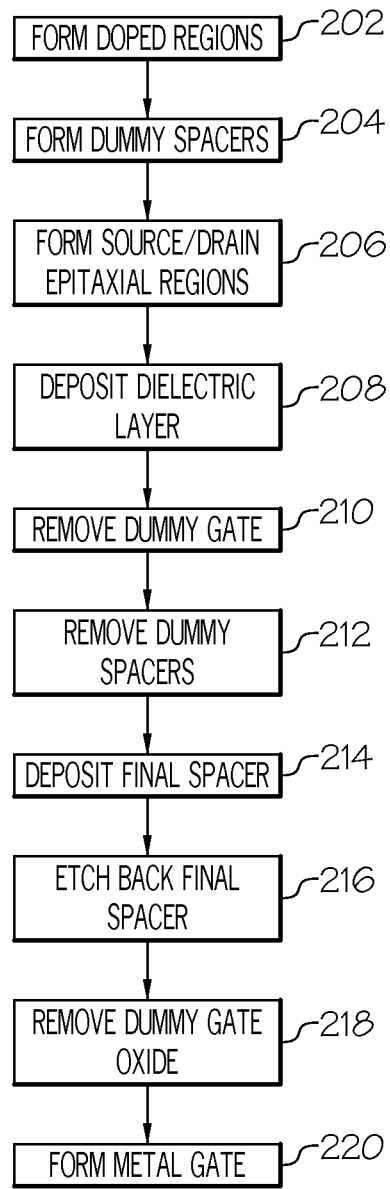
FIG. 12 is a flowchart indicating process steps for embodiments of the present invention.

FIG. 12 is a flowchart indicating process steps for embodiments of the present invention. At 202, a plurality of doped regions are formed on a semiconductor substrate, wherein the plurality of doped regions are formed adjacent to a dummy gate disposed on a dummy gate oxide, the dummy gate oxide disposed on the semiconductor substrate. At 204, a plurality of dummy spacers are formed, wherein the plurality of dummy spacers are disposed adjacent to the dummy gate. At 206, a plurality of source/drain regions are formed adjacent to the dummy gate. At 208, a dielectric layer is deposited over the source/drain regions. At 210, the remaining dummy gate is removed to form a gate cavity. At 212, the plurality of dummy spacers is removed. At 214, a final spacer layer is deposited. At 216, an etch of the final spacer layer is performed to form final spacers. At 218, the dummy gate oxide is removed. At 220, a metal gate is formed in the gate cavity.

Figure 13:
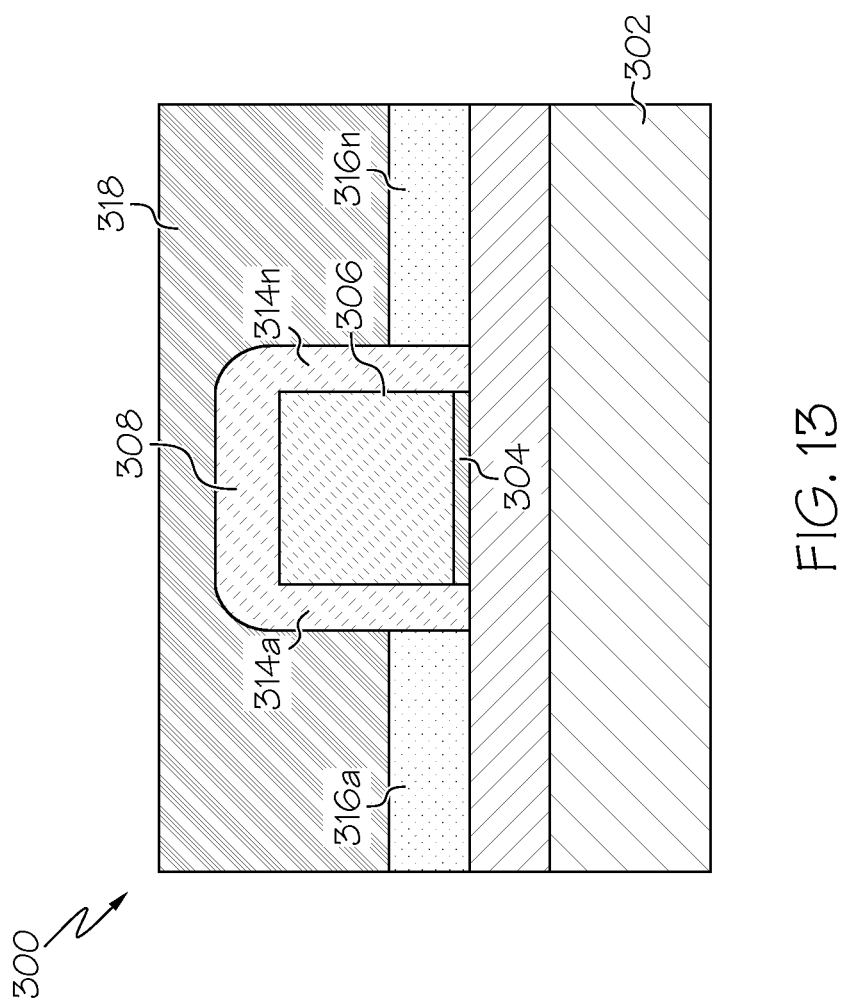
FIG. 13 shows a semiconductor structure at a starting point for alternative embodiments of the present invention.

FIG. 13 shows a semiconductor structure 300 at a starting point for alternative embodiments of the present invention. Semiconductor structure 300 comprises a semiconductor substrate 302. In embodiments, the semiconductor substrate 302 may be silicon (Si) or silicon-on-insulator (SOI). A dummy gate oxide 304 is disposed over the semiconductor substrate 302. In embodiments, the dummy gate oxide 304 may be an oxide such as silicon oxide. A dummy gate 306 is disposed on the dummy gate oxide 304. In embodiments, the dummy gate may be polysilicon or other suitable material. A gate capping layer 308 may be disposed over the dummy gate 306. In embodiments, the gate capping layer 308 may be a nitride such as silicon nitride (SiN), or a low-k material such as SiBCN or SiOCN. A plurality of dummy spacers 314a and 314n are formed adjacent dummy gate 306. In some embodiments, the plurality of dummy spacers 314a and 314n are silicon nitride, SiBCN, and/or SiOCN. A plurality of source/drain regions 316a and 316n are formed adjacent the dummy spacers 314a and 314n. In embodiments, the plurality of source/drain regions 316a and 316n may be epitaxial source/drain regions. In embodiments, the plurality of source/drain regions 316a and 316n may include silicon, silicon germanium, or another suitable material. A dielectric layer 318 is disposed over the plurality of source/drain regions 316a and 316n. In embodiments, the dielectric layer 318 may be silicon oxide, or multiple layers of various oxides and/or other dielectric layers previously mentioned, such as hafnium oxide, silicon oxide, and/or zirconium oxide.

Figure 14:
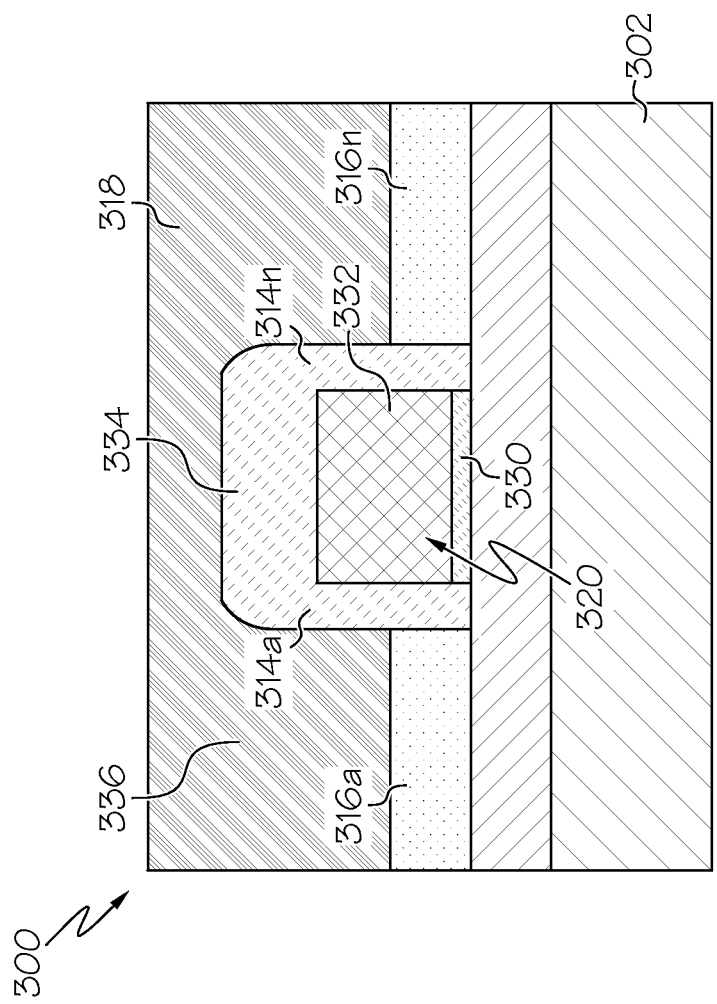
FIG. 14 shows a semiconductor structure after a subsequent replacement metal gate process.

FIG. 14 shows a semiconductor structure 300 after a subsequent replacement metal gate process. The dielectric layer 318 is opened up, and the gate capping layer 108 is removed from over the gate 306. In some embodiments, the removal is achieved by a reactive ion etch process or another suitable method. The dummy gate 306 is then removed, in some embodiments, by, for example, a selective etch process. A gate cavity 320 is therefore formed between the plurality of spacers. A gate oxide 330 is deposited into the gate cavity. In some embodiments, the gate oxide 330 may be hafnium oxide. A replacement metal gate 332 is deposited into the cavity over the gate oxide 330. In some embodiments, the metal gate 332 is tungsten, aluminum, and/or other work function metals (not shown). A self-aligned gate capping layer 334 is deposited over the replacement metal gate 332. In embodiments, the gate capping layer 334 may be a nitride such as silicon nitride. Additional dielectric material 318 then covers the capping layer 334. In embodiments, the dielectric material 318 may be comprised of an oxide, such as silicon oxide or tetraethyl orthosilicate (TEOS).

Figure 15:
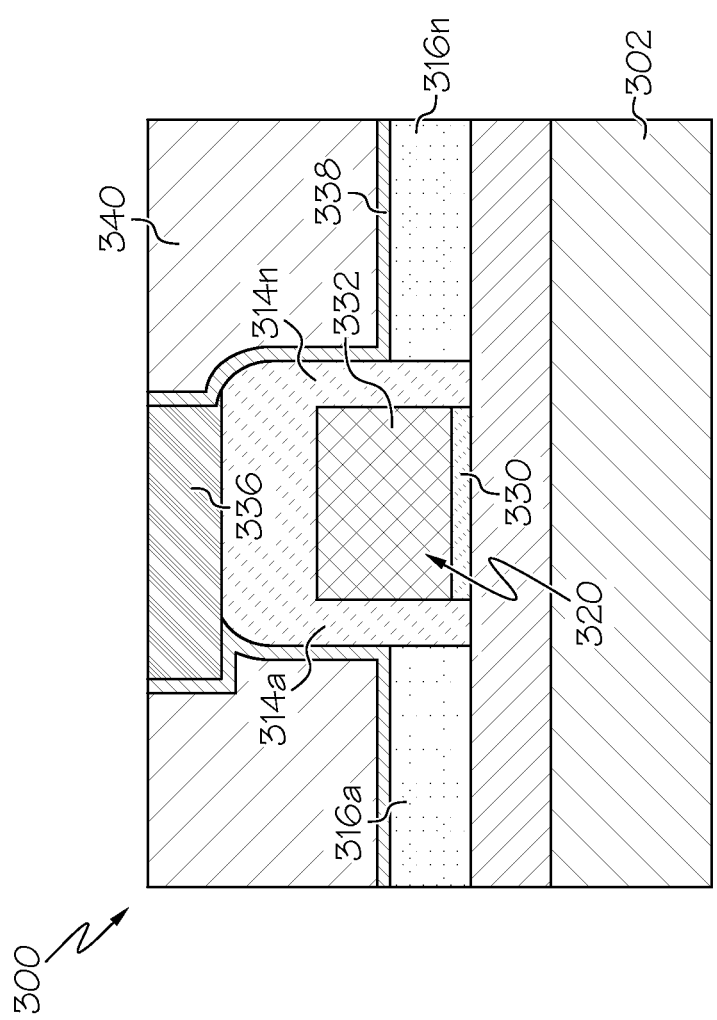
FIG. 15 shows a semiconductor structure after a subsequent process of depositing a contact metal.

FIG. 15 shows a semiconductor structure 300 after a subsequent process of depositing a contact metal. The dielectric layer 318 is removed except for region 336. In some embodiments, the removal is achieved by, for example, a selective wet or dry etch. A liner 338 is deposited, in some embodiments, by atomic layer deposition or another suitable method. In embodiments, liner 338 may include titanium nitride or another suitable material. A source/drain contact metal 340 is deposited over liner 338. In embodiments, the source/drain contact metal 340 may be tungsten. The structure 300 may be planarized using, for example, a chemical mechanical planarization process to leave the contact metal 340 flush with the dielectric layer 336.

Figure 16:
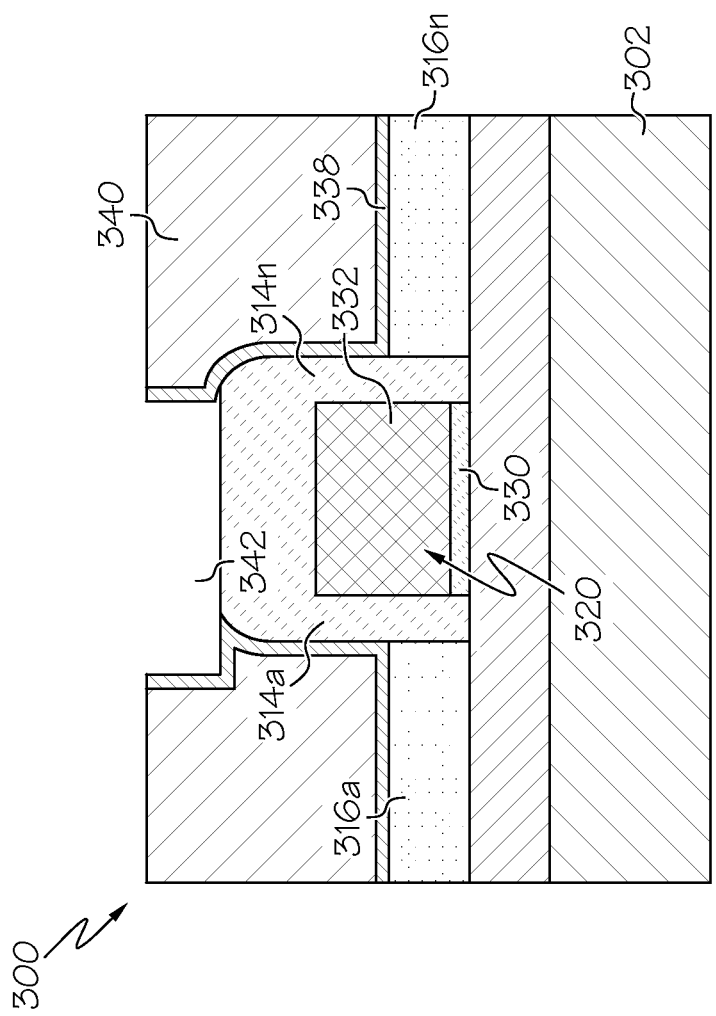
FIG. 16 shows a semiconductor structure after a subsequent process of exposing the gate cap region.

FIG. 16 shows a semiconductor structure 300 after a subsequent process of exposing the gate cap region. The dielectric layer 336 may be selectively removed to expose the capping layer 334 by forming opening 342.

Figure 17:
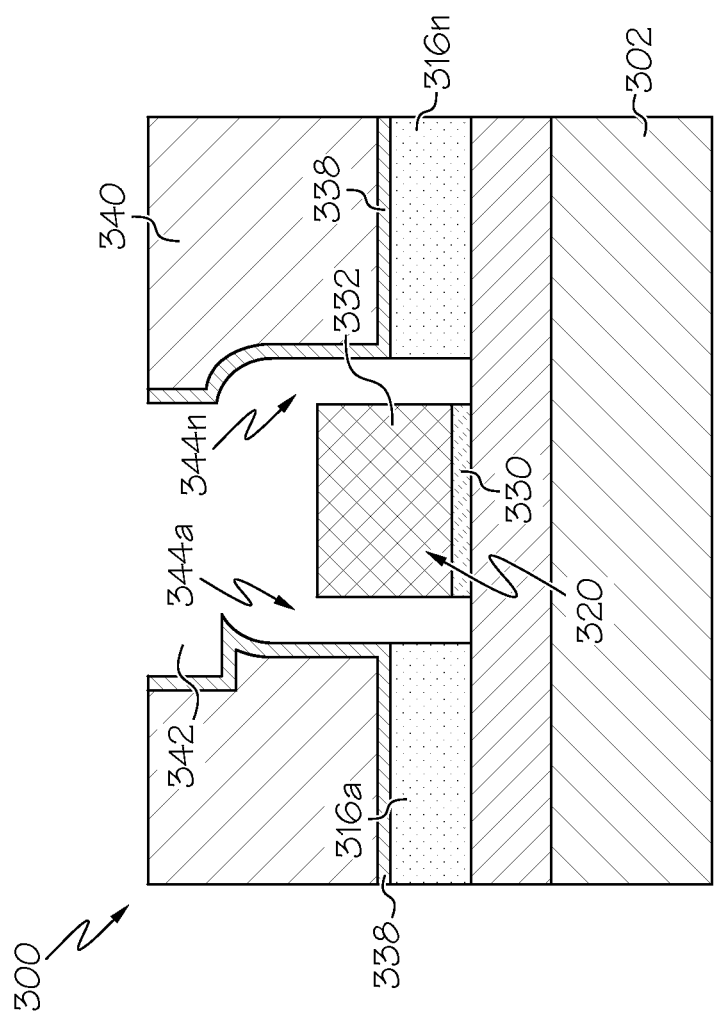
FIG. 17 shows a semiconductor structure after a subsequent process of forming spacer cavities.

FIG. 17 shows a semiconductor structure 300 after a subsequent process of forming spacer cavities. Each spacer cavity 344a and 344n is formed by selectively removing the dummy spacers. This can be achieved by a wet etch, for example a hot phosphoric acid etch process selective to silicon nitride, a reactive ion etch process (RIE), or other selective dry removal processes, such as Frontier, or a combination of these processes.

Figure 18:
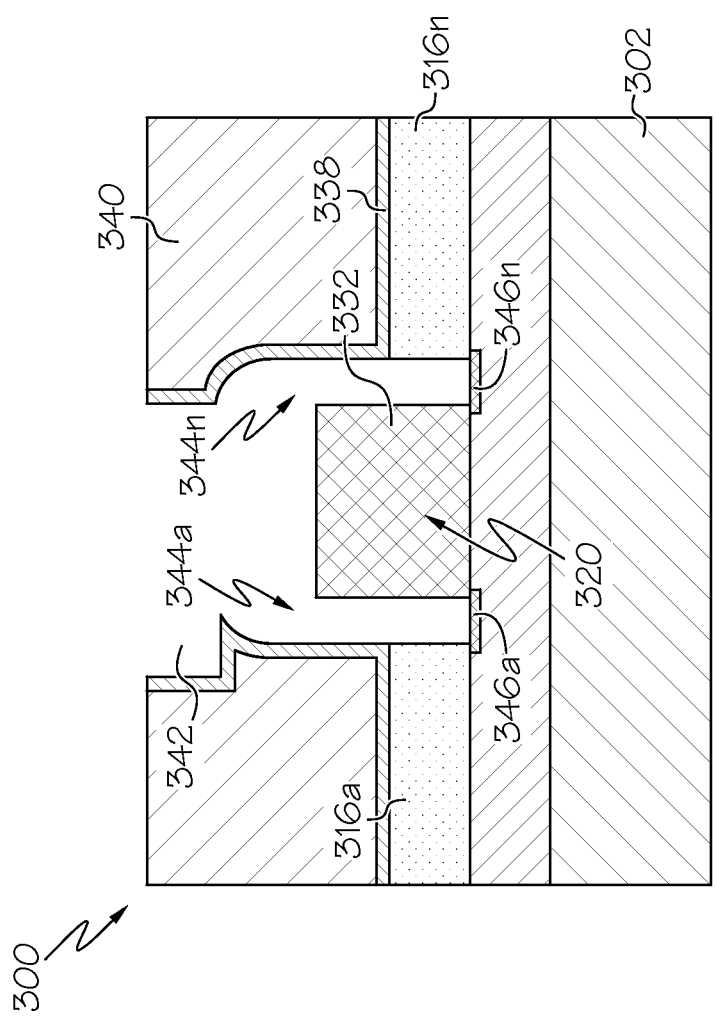
FIG. 18 shows a semiconductor structure after a subsequent process of forming doped regions at the bottom of the spacer cavities.

FIG. 18 shows a semiconductor structure 300 after a subsequent process of forming doped regions at the bottom of the spacer cavities. Doped regions 346a and 346n are formed at a bottom of each spacer cavity 344a and 344n. In embodiments, the doping can be achieved by a plasma doping process, or a monolayer doping process. In embodiments, doped regions 346a and 346n may be arsenic, boron, antimony, phosphorus, and/or other elements suitable to the channel material.

Figure 19:
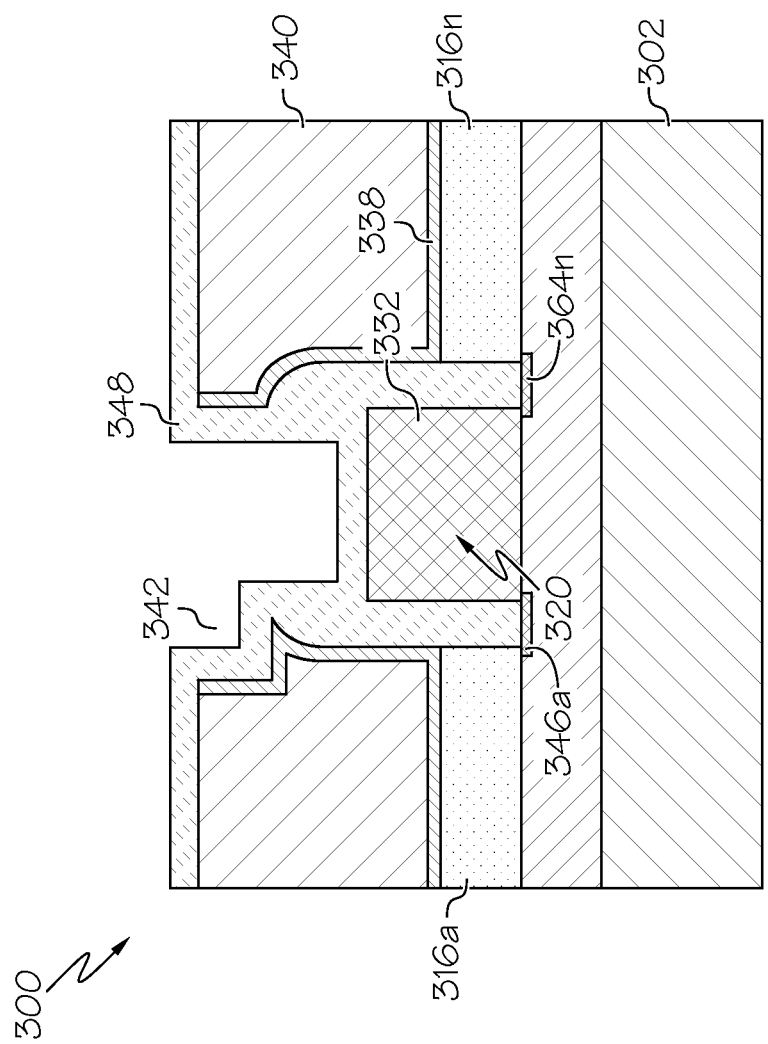
FIG. 19 shows a semiconductor structure after a subsequent process of depositing a final spacer material.

FIG. 19 shows a semiconductor structure 300 after a subsequent process of depositing a final spacer material. A final spacer material 348 is deposited. In some embodiments, the deposition may be achieved by, for example, atomic layer deposition, or chemical vapor deposition. In some embodiments, final spacer material 348 may be, for example, silicon nitride and/or SiBCN or SiOCN. From this point forward, industry standard techniques may be used to complete fabrication of the integrated circuit. This may include, without limitation, gate contact formation and/or filling the remaining cavity with a dielectric layer.

Figure 20:
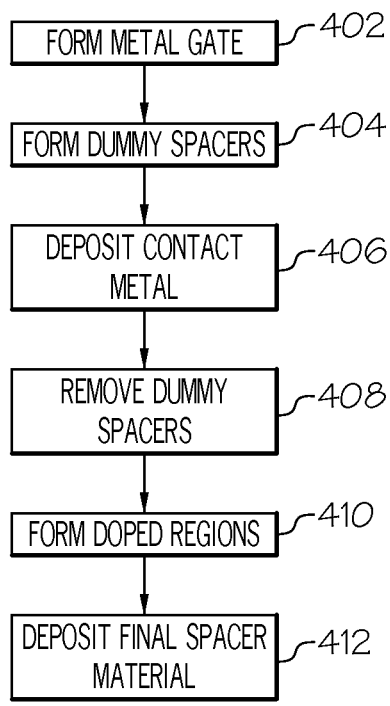
FIG. 20 is a flowchart indicating process steps for alternative embodiments of the present invention.

FIG. 20 is a flowchart indicating process steps for alternative embodiments of the present invention. At 402, a metal gate is formed on semiconductor structure. At 404, a plurality of dummy spacers are formed adjacent to the metal gate. At 406, a contact metal is deposited adjacent to the plurality of dummy spacers. At 408, the plurality of dummy spacers is removed to form a plurality of spacer cavities. At 410, doped regions are formed at a bottom portion of each spacer cavity of the plurality of spacer cavities. At 412, a final spacer material is deposited in each spacer cavity of the plurality of spacer cavities.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Moreover, in particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application. Therefore, it is to be understood that the appended claims are intended to cover all such modifications and changes that fall within the true spirit of the invention.

What is claimed is:

1. A method of forming a semiconductor structure, comprising:
    forming a plurality of doped regions in a semiconductor channel disposed on a semiconductor substrate, wherein the plurality of doped regions are formed adjacent to a dummy gate disposed on a dummy gate oxide, the dummy gate oxide disposed on the semiconductor substrate;
    forming a plurality of dummy spacers, wherein the plurality of dummy spacers are disposed adjacent to the dummy gate;
    forming a plurality of source/drain regions adjacent to the dummy gate;
    depositing a dielectric layer over the source/drain regions;
    removing the dummy gate to form a gate cavity;
    removing the plurality of dummy spacers;
    depositing a final spacer layer after removing the plurality of dummy spacers;
    performing an etch of the final spacer layer to form final spacers;
    removing the dummy gate oxide after performing the etch of the final spacer layer; and
    forming a metal gate in the gate cavity.

2. The method of claim 1, further comprising forming a silicon nitride gate cap on the metal gate.

3. The method of claim 1, wherein forming the plurality of source/drain regions comprises forming epitaxial silicon regions.

4. The method of claim 1, wherein forming the plurality of source/drain regions comprises forming epitaxial silicon germanium regions.

5. The method of claim 1, wherein removing the dummy gate oxide is performed with a chemical oxide removal process.

6. The method of claim 1, wherein removing the dummy gate oxide is performed with a Siconi process.

7. The method of claim 1, wherein depositing the final spacer layer is performed with an atomic layer deposition process.

8. The method of claim 1, wherein depositing the final spacer layer comprises depositing at least one of SiBCN and SiOCN.

* * * * *